US007751059B2

(12) United States Patent
Van Asten et al.

(10) Patent No.: US 7,751,059 B2
(45) Date of Patent: *Jul. 6, 2010

(54) METHOD FOR CORRECTING DISTURBANCES IN A LEVEL SENSOR LIGHT PATH

(75) Inventors: Nicolaas Antonius Allegondus Johannes Van Asten, Breda (NL); Oana Cristina Balan, Eindhoven (NL); Luberthus Ouwehand, 's-Hertogenbosch (NL); Machiel Jacobus Johannes Viguurs, Rosmalen (NL); Alexander Charles Franciscus Anna Van Well, Best (NL); Lun Kai Cheng, Krimpen aan den Ijssel (NL); Huibert Blokland, Noordeloos (NL); Elke Van Loenhout, Eindhoven (NL); Hans Baltus Bakker, Utrecht (NL)

(73) Assignee: ASML Netherlands B.V., Veldhoven (NL)

( * ) Notice: Subject to any disclaimer, the term of this patent is extended or adjusted under 35 U.S.C. 154(b) by 821 days.

This patent is subject to a terminal disclaimer.

(21) Appl. No.: 11/446,563

(22) Filed: Jun. 5, 2006

(65) Prior Publication Data
US 2007/0013915 A1 Jan. 18, 2007

Related U.S. Application Data

(63) Continuation-in-part of application No. 11/252,254, filed on Oct. 18, 2005, now Pat. No. 7,411,667.
(60) Provisional application No. 60/686,965, filed on Jun. 3, 2005.

(51) Int. Cl.
*G01B 11/02* (2006.01)
(52) U.S. Cl. ...................................... 356/500; 356/508
(58) Field of Classification Search .............. 356/139.1, 356/496, 508, 509, 510, 516
See application file for complete search history.

(56) References Cited

U.S. PATENT DOCUMENTS 6,124,601 A 9/2000 Yoshii et al.
(Continued)

FOREIGN PATENT DOCUMENTS

JP 09167737 6/1997

(Continued)

OTHER PUBLICATIONS

Office Action issued by the Japanese Patent Office on Aug. 31, 2009 for corresponding Patent Application 2006-155056.

*Primary Examiner*—Patrick J Connolly
(74) *Attorney, Agent, or Firm*—Pillsbury Winthrop Shaw Pittman, LLP

(57) ABSTRACT

A level sensor for determining a height of a substrate. In one configuration, the level sensor forms part of a lithographic apparatus that includes a projection lens system. The level sensor generates one or more measurement beams and directs the measurement beam to a measurement spot on a substrate having a first reflecting surface, and produces a reflected measurement beam. The level sensor also generates one or more reference beams. A detector detects both the reflected measurement beam and the reference beam, respectively, and produces a measurement signal and a reference signal, respectively, the measurement signal being indicative for the height at the measurement spot. A processor that receives these signals and corrects the measurement signal based on the reference signal. In one configuration, the level sensor has an optical element arranged to direct the reference beam towards a detection branch via an optical reference path arranged to be insensitive to the position of the projection lens system and the first reflecting surface. In one configuration, the level sensor is configured to direct the measurement beam and reference beam along optical paths that are at least partially substantially equal in at least one of the reference branch and the projection branch.

16 Claims, 5 Drawing Sheets

U.S. PATENT DOCUMENTS

| | | | |
|---|---|---|---|
| 6,501,553 B1 | 12/2002 | Ogawa et al. | |
| 6,507,405 B1 | 1/2003 | Grek et al. | |
| 6,806,966 B1* | 10/2004 | Mueller et al. | 356/514 |
| 2004/0000627 A1* | 1/2004 | Schuster | 250/201.2 |
| 2004/0080737 A1* | 4/2004 | Jasper et al. | 355/55 |
| 2005/0037288 A1* | 2/2005 | Chen | 430/311 |
| 2005/0046885 A1 | 3/2005 | Morikawa | |
| 2005/0057757 A1* | 3/2005 | Colonna De Lega et al. | 356/497 |
| 2005/0068540 A1* | 3/2005 | De Groot et al. | 356/512 |
| 2005/0078320 A1* | 4/2005 | Mueller et al. | 356/512 |
| 2005/0179909 A1* | 8/2005 | Krijnen | 356/500 |
| 2006/0274324 A1* | 12/2006 | Van Asten et al. | 356/516 |
| 2008/0309915 A1* | 12/2008 | Van Asten et al. | 356/4.08 |

FOREIGN PATENT DOCUMENTS

| | | |
|---|---|---|
| JP | 10009831 | 1/1998 |
| JP | 2000-81320 A | 3/2000 |
| JP | 20010351860 | 2/2001 |

\* cited by examiner

METHOD FOR CORRECTING DISTURBANCES IN A LEVEL SENSOR LIGHT PATH

RELATED APPLICATIONS

This application is a continuation in part and claims the benefit of U.S. patent application Ser. No. 11/252,254, filed Oct. 18, 2005, now U.S. Pat. No. 7,411,667, and claims priority to U.S. Provisional Application No. 60/686,965, filed Jun. 3, 2005, both hereby incorporated by reference in their entirety

FIELD OF THE INVENTION

The present invention relates to lithographic apparatus and more specific to level sensors.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In lithography, a Level Sensor (LS) is used for measuring the substrate height. The substrate height is measured at multiple positions on the substrate; this is done using multiple LS spots (or "measurement spots") in parallel. Noise and drift in the Level Sensor will deteriorate the accuracy and reproducibility of the measured positions. This noise and drift can be caused by movements of mechanical and optical parts of the LS system, drift and noise of electrical parts of the LS system and changes in the (optical) refractive-index of the media (e.g. air, glass) through which light beams of the LS system pass. All the LS spots can be influenced by these effects, also spots which measure on a reference surface. To separate the noise and drift from the signal introduced by a height change of the substrate, noise and drift are measured independently from the height measurement, using a reference beam. The signal from the reference beam is subtracted from the measurement spots which measure on the substrate, to correct for the disturbance. This will give a noise-free and drift-free position measurement.

However, there may be a disturbance in the reference beam that is not the same as the disturbance in the measurement beam(s). Reasons for a difference in disturbance of the reference beam with reference to the disturbance of a measurement beam may be:

Time delay of disturbance; the disturbance is not seen at the same time for all LS spots (phase difference between LS spots);

Location of disturbance; very local disturbances in air at the focus point of the LS spots may only be seen by few LS spots;

Movement or deformation of mechanical components in LS will have a different effect on the different LS spots.

SUMMARY

It is desirable to improve the known correction methods for a level sensor.

According to one configuration of the invention, a level sensor for determining a height of a substrate comprises: a measurement beam generator configured to generate at least one measurement beam and direct the at least one measurement beam to a measurement spot on the substrate in order to produce at least one reflected measurement beam; a reference beam generator configured to generate at least one reference beam; a detector configured to detect both the at least one reflected measurement beam and the at least one reference beam, respectively, and to produce at least one measurement signal and at least one reference signal, respectively, the measurement signal being indicative of the height at the measurement spot; a processor configured to correct the measurement signal based on the reference signal; and an optical arrangement arranged above the substrate, wherein the at least one measurement beam and the at least one reference beam project along substantially equal but different optical paths of propagation outside of the predetermined area, the optical arrangement being arranged to deviate the at least one reference beam from the substantially equal but different optical paths of propagation in the predetermined area such that the at least one reference beam does not hit the substrate.

In one configuration, the optical arrangement comprises a prism having a parallelepiped form. In one configuration, the prism comprises an input surface arranged to receive the at least one reference beam, a reflective surface arranged to internally reflect the reference beam and an output surface for outputting the reflected beam, the reflective surface having two sub-surfaces connected to one another under an angle.

In another configuration, the optical arrangement comprises a plurality of mirrors. In one configuration, the level sensor is arranged to produce at least one original beam and the plurality of mirrors comprises a semi-transparent mirror arranged to receive the at least one original beam, and to split the at least one original beam into the at least one measurement beam and the at least one reference beam.

In one configuration, the level sensor is arranged to measure the height of the substrate at a plurality of measurement spots and to produce a wafer map comprising the height based on the plurality of measurement spots.

In another configuration, the level sensor is arranged to correct for noise and drift in the measurement signal by comparing noise and drift in the measurement signal with noise and drift in the reference signal.

In a further configuration, the measurement beam generator is arranged to produce a plurality of measurement beams, and to produce a plurality of measurement spots using the measurement beams, wherein the detector is configured to detect a plurality of measurement signals associated with the plurality of measurement spots, wherein the reference beam generator is configured to generate a plurality of reference beams and a plurality of reference signals based on these reference beams, and wherein the processor is configured to determine a disturbance of at least one of these measurement beams by using interpolation of reference signals.

In still another configuration, the measurement beam generator is arranged to produce a plurality of measurement beams, and to produce a plurality of measurement spots using the measurement beams, wherein the detector is configured to detect a plurality of measurement signals associated with the plurality of measurement spots, wherein the reference beam generator is configured to generate a plurality of reference beams and a plurality of reference signals based on these reference beams, and wherein the processor is configured to measure a correlation between time traces of at least two of the plurality of measurement signals and reference signals, to calculate a correlation coefficient relating to this correlation, and to use the correlation coefficient as a weighting factor to determine an amount to correct the measurement signals.

In another configuration, the measurement beam generator is arranged to produce a plurality of measurement beams, and to produce a plurality of measurement spots by the measurement beams, wherein the detector is configured to detect a plurality of measurement signals associated with these plurality of measurement spots, wherein the reference beam generator is configured to generate a plurality of reference beams and a plurality of reference signals based on the reference beams, and wherein the processor is configured to measure a correlation for a part of a frequency spectrum between at least two of the plurality of measurement signals and reference signals, and to correct the measurement signals in the part of the frequency spectrum.

In another configuration, the measurement beam generator is arranged to produce a plurality of measurement beams, and to produce a plurality of measurement spots by these measurement beams, wherein the detector is configured to detect a plurality of measurement signals associated with these plurality of measurement spots, wherein the reference beam generator is configured to generate a plurality of reference beams and a plurality of reference signals based on the reference beams, and wherein the processor is configured to measure a delay between time traces of at least two of the plurality of measurement signals and reference signals, and to use the delay in a delay correction method to correct the plurality of measurement signals.

In a further configuration, the measurement beam generator is arranged to produce a plurality of measurement beams, and to produce a plurality of measurement spots by these measurement beams, wherein the detector is configured to detect a plurality of measurement signals associated with these plurality of measurement spots, wherein the reference beam generator is configured to generate a plurality of reference beams and a plurality of reference signals based on these reference beams, and wherein the processor is configured to measure a phase shift for a part of a frequency spectrum between at least two of the measurement signals and reference signals, and to correct the measurement signals in the part of the frequency spectrum.

In one configuration, the level sensor is contained in an imaging apparatus arranged to produce an image to be imaged on the substrate. The imaging apparatus can be, for example, a lithographic projection apparatus. In one configuration, the lithographic projection apparatus comprises an exposure stage, a measurement stage and the imaging apparatus.

In one aspect of the invention, a method of determining a height of a substrate comprises: generating at least one measurement beam and directing the at least one measurement beam to a measurement spot on the substrate in order to produce at least one reflected measurement beam; generating at least one reference beam; detecting both the at least one reflected measurement beam and the at least one reference beam, respectively, and producing at least one measurement signal and at least one reference signal, respectively, the measurement signal being indicative of the height at the measurement spot; correcting the measurement signal based on the reference signal; arranging an optical arrangement above a substrate location; directing the at least one measurement beam and the at least one reference beam along substantially equal optical paths of propagation outside of the predetermined area; and deviating by the optical arrangement the at least one reference beam in the predetermined area from an optical path of propagation of a measurement beam such that the at least one reference beam does not hit the substrate.

In a further aspect of the invention, a level sensor for determining a height of a substrate comprises: at least one source of radiation to generate at least one reference beam and to generate at least one measurement beam and direct the at least one measurement beam to a measurement spot on the substrate in order to produce at least one reflected measurement beam; at least one detector to detect both the at least one reflected measurement beam and the at least one reference beam, respectively, and to produce at least one measurement signal and at least one reference signal, respectively, the measurement signal being indicative of the height at the measurement spot; and a processor to receive the at least one measurement signal and the at least one reference signal, and to correct the measurement signal based on the reference signal; wherein the level sensor comprises an optical arrangement arranged in a predetermined area close to a substrate location, and wherein the level sensor is arranged to project the at least one measurement beam and the at least one reference beam along substantially equal optical paths of propagation apart from in the predetermined area, the optical arrangement being arranged to deviate in the predetermined area the at least one reference beam from an optical path of propagation of the measurement beam such that the at least one reference beam does not hit the substrate.

According to an aspect of the invention there is provided a lithographic apparatus comprising: a projection lens system, a projection branch arranged to direct an measurement beam towards a measurement position in a predetermined plane and to direct an reference beam towards a reference position, a detection branch being arranged to measure transversal displacement of the measurement beam and the reference beam, a substrate stage for supporting an object having a first reflecting surface in the predetermined plane, an optical reference element arranged to direct the reference beam towards the level sensor detection branch via an optical reference path arranged to be insensitive to the position of the projection lens system and the first reflecting surface, at least one of the projection branch and the reference branch arranged to direct the measurement beam and the reference beam along optical paths that are at least partially substantially equal in at least one of the projection branch and the reference branch and which lithographic apparatus is characterized by the optical reference element being arranged between the projection branch and the predetermined plane.

Where the measurement beam and reference beam are substantially equal, they undergo related transversal displacements. Therefore the reference beam can be used to correct the measurement beam. Since the optical reference element is arranged between the projection branch and the predetermined plane, and not in the projection branch or the reference branch, the measurement beam and reference beam can be substantially equal in throughout the measurement branch, the projection branch or both, in which cases related transversal displacements throughout the measurement branch, the projection branch or both can be corrected for by using the reference beam. The same applies, mutatis mutandis, if the measurement beam and reference beam are substantially equal in only a part of the projection branch, the reference branch or both.

In an embodiment of the invention, at least one of the projection branch and the detection branch is arranged to direct the measurement beam and the reference beam along optical paths that are at least partially substantially parallel.

Per definition optical beams progress through a medium. In case the measurement beam and the reference beam are parallel in the projection branch, the angle between a gradient in the index of refraction of the medium between the optical elements of the projection branch and the measurement beam is equal to the angle between the gradient and the reference beam. This does not depend on the position of the gradient along the optical axis of the projection branch. Therefore the transversal displacements of the measurement beam and the reference beam are equal as far as caused by the gradient. Therefore the measurement signal can be accurately corrected for the gradient by subtracting the reference signal. The same applies, mutatis mutandis, if the measurement beam and reference beam are parallel in the detection branch in stead of the measurement branch or in both the measurement branch and the reference branch or at partially parallel.

In an embodiment of the invention, at least one of the projection branch and the detection branch is arranged to direct the measurement beam and the reference beam along optical paths that are at least partially overlap.

Where the measurement beam and the reference beam overlap, they are affected by the same noise, such as gradient in the index of refraction. The same effects being present in the measurement beam and the reference beam, the reference beam can be used to correct the measurement beam.

In an embodiment of the invention, the lithographic apparatus according to the invention, the lithographic apparatus having an optical measurement path in a measurement plane, the optical measurement path being a path from the measurement branch to the detection branch along which the measurement beam progresses, is characterized by control means arranged to set a gradient along the measurement plane in the index of refraction of at least a part of at least one of the optical measurement path and the optical reference path to a predetermined value.

This is advantageous because in case a gradient in the index of refraction is predetermined along a part of the optical reference path, the reference beam will experience a predetermined displacement. This displacement can then be compensated for. The same applies, mutatis mutandis, for predetermined values of the gradient along the optical measurement path.

In an embodiment of the invention the lithographic apparatus according to the invention is characterized by the optical reference element comprising a prism having an input surface arranged to receive the reference beam from the projection branch, a second reflective surface arranged to internally reflect the reference beam from the input surface and an output surface arranged for outputting said reflected beam.

This is advantageous because the index of refraction is very stable inside the prism because there is no flow of the medium in the glass, so that the effect of the prism on the position of the reference beam will be stable.

In an embodiment of the invention the lithographic apparatus according to the invention is characterized by: the measurement beam and the reference beam being parallel in both the projection branch and the reference branch; the measurement position and the reference position being in focus of the projection branch and the reference branch; a third reflecting surface arranged to reflect the reference beam at the reference position to a second position on the second reflecting surface after being reflected by the second reflecting surface in a first position.

Symmetry between the projection branch and the detection branch is advantageous to overcome aberrations. Because of symmetry, the measurement beam and the reference beam are parallel in both the projection branch and the detection branch and the measurement position and the reference position are in focus of both the projection branch and the reference branch.

By having the measurement position in focus of both the projection branch and the reference branch, a small spot can be detected by the detection branch. A small spot at the measurement position means that a corresponding measurement signal comprises height information of only a small area on the first reflecting surface.

Because of the symmetry and in absence of the optical reference element (i.e. the prism) the reference position is also in focus for the projection branch. However, in a prism the index of refraction differs from the index of refraction the reference beam experiences without the prism. Therefore the reference position may be formed further along the optical reference path than without the prism. At such a position the reference position is out of focus of the detection branch. By reflecting the reference beam to the third reflecting surface and back to the second reflecting surface, the optical reference path length from the projection branch to the reference spot can be set independently of the optical reference path length from the reference spot to the detection branch.

In an embodiment of the invention, the lithographic apparatus according to the invention is characterized by the first position being on a first sub-surface of the second reflecting surface and the second position being on a second sub-surface of the second reflecting surface; the first sub-surface and the second sub-surface being arranged at an angle.

By placing the first sub-surface and the second sub-surface under an angle, the optical path length for the projection branch and the detection branch can be influenced. In an embodiment of the invention the lithographic apparatus according to the invention is characterized by at least one of the input surface and the output surface being perpendicular to the optical path of the reference beam.

At a surface perpendicular to the optical path, there is less dispersion. In an embodiment of the invention the lithographic apparatus according to the invention is characterized by the projection branch, the detection branch and the optical reference element being arranged to accommodate one or more additional measurement beams.

In an embodiment of the invention the lithographic apparatus according to the invention is characterized by: the projection branch being arranged to direct one or more additional optical reference beams towards one or more additional reference positions; the detection branch being arranged to measure transversal displacement of the one or more additional reference positions; the optical reference element being arranged to direct the one or more additional reference beams via one or more additional optical reference paths that are insensitive to the position of the projection lens system and the first reflecting surface towards the detection branch; and the measurement beam, the reference beam and the additional reference beams being at least partially substantially equal in at least one of the projection branch and the reference branch.

The advantage is that with more reference information better reference information is available.

According to an aspect of the invention, there is provided a method for correcting level sensor measurements with reference measurements comprising the steps of: carrying out one or more object measurements to determine the position of a reflecting object arranged to reflect an optical measurement beam by measuring the position of the optical measurement beam; and carrying out one or more reference measurements to determine the position of a first optical reference beam arranged away from (or spaced from) the reflecting object, characterized by:

determining a first relation between the position of the optical measurement beam and the position of the first optical reference beam based upon the one or more object measurements and the one or more reference measurements; and using the first relation to correct the one or more object measurements with the one or more reference measurements.

According to the invention, a mere subtraction of the one or more reference measurements from the one or more object measurements is avoided. In stead, the one or more object measurements and the one or more reference measurements are used themselves to determine a first relation between them. The first relation establishes how the one or more reference measurements should be used to correct the one or more object measurements.

In an embodiment of the invention, the method according to the invention is characterized by performing at least a part of the one or more reference measurements after a first measurement out of the one or more object measurements.

By performing at least a part of the one or more reference measurements after a first measurement out of the one or more object measurements, the effects influencing the reference beam only of after the first measurement, are corrected for.

In an embodiment of the invention, the method according to the invention is characterized by scanning the reflecting object during carrying out at least two of the one or more object measurements.

According to the invention, the position of at least two points on the reflecting object are be obtained while obtaining the information necessary to determine the first relation. This means that less time is needed to complete the measurements.

In an embodiment of the invention the method according to the invention is characterized by computing the correlation function based upon the one or more object measurements and the one or more reference measurements.

A time delay between an effect measured in the one or more reference measurements and the effect measured in the one or more object measurements will appear in a peak of the correlation function at that time delay. Therefore, the time delay will be accounted for while correcting the one or more object measurements.

In an embodiment of the invention, the method according to the invention is characterized by computing the correlation function and correcting the one or more object measurements in the Fourier domain.

In the Fourier domain, the computation of the correlation function can be performed much faster than in the time domain. Therefore, the correction can be performed much faster.

In an embodiment of the invention the method according to the invention is characterized by correcting the one or more object measurements only in a part of the Fourier domain.

In an embodiment of the invention the method according to the invention wherein the one or more object measurements corrected with the one or more reference measurements using the first relation form one or more corrected measurements is characterized by: carrying out one or more additional reference measurements to determine the position of a second optical reference beam arranged away from the reflecting object; determining a second relation between the one or more corrected measurements and the one or more additional reference measurements; and using the second relation to correct the one or more corrected measurements with the one or more additional measurements.

A second optical reference beam is used to improve the correction of the one or more object measurements. By determining the second relation, it is established how the one or more additional reference measurements should be used to correct the one or more corrected measurements.

According to an aspect of the invention, there is provided a method for correcting level sensor measurements with reference measurements comprising the steps of: carrying out one or more object measurements to determine the position of a reflecting object arranged to reflect an optical measurement beam by measuring the position of the optical measurement beam; carrying out one or more reference measurements to determine the position of a first optical reference beam arranged away from the reflecting object; and carrying out one or more further additional measurements to determine the position of a second optical reference beam arranged away from the reflecting object, characterized by: determining a third relation between the position of the first optical reference beam and the position of the second optical reference beam based upon the one or more reference measurements and the one or more further additional measurements; and using the third relation to correct the one or more object measurements with the one or more reference measurements and the one or more further additional measurements.

Effects present in two reference beams are highly predictive for effects present in the measurement beam. Only one relation, the third relation, is determined indicative of the effects common to the first and second reference beam and the measurement beam. Calculating only one relation is efficient and therefore can be performed quickly.

According to an aspect of the invention, there is provided a method for correcting level sensor measurements with reference measurements comprising the steps of: carrying out one or more object measurements to determine the position of a reflecting object arranged to reflect an optical measurement beam by measuring the position of the optical measurement beam; and carrying out one or more reference measurements to determine the position of a first optical reference beam arranged away from the reflecting object, characterized by: carrying out one or more further additional measurements to determine the position of a second optical reference beam arranged away from the reflecting object; determining a correction by interpolating between the one or more reference measurements and the one or more further additional measurements; and applying the correction on the one or more object measurements with the correction. Because interpolation is a fast process, the determination of the correction can be performed quickly, resulting in a fast method for correcting level sensor measurements.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
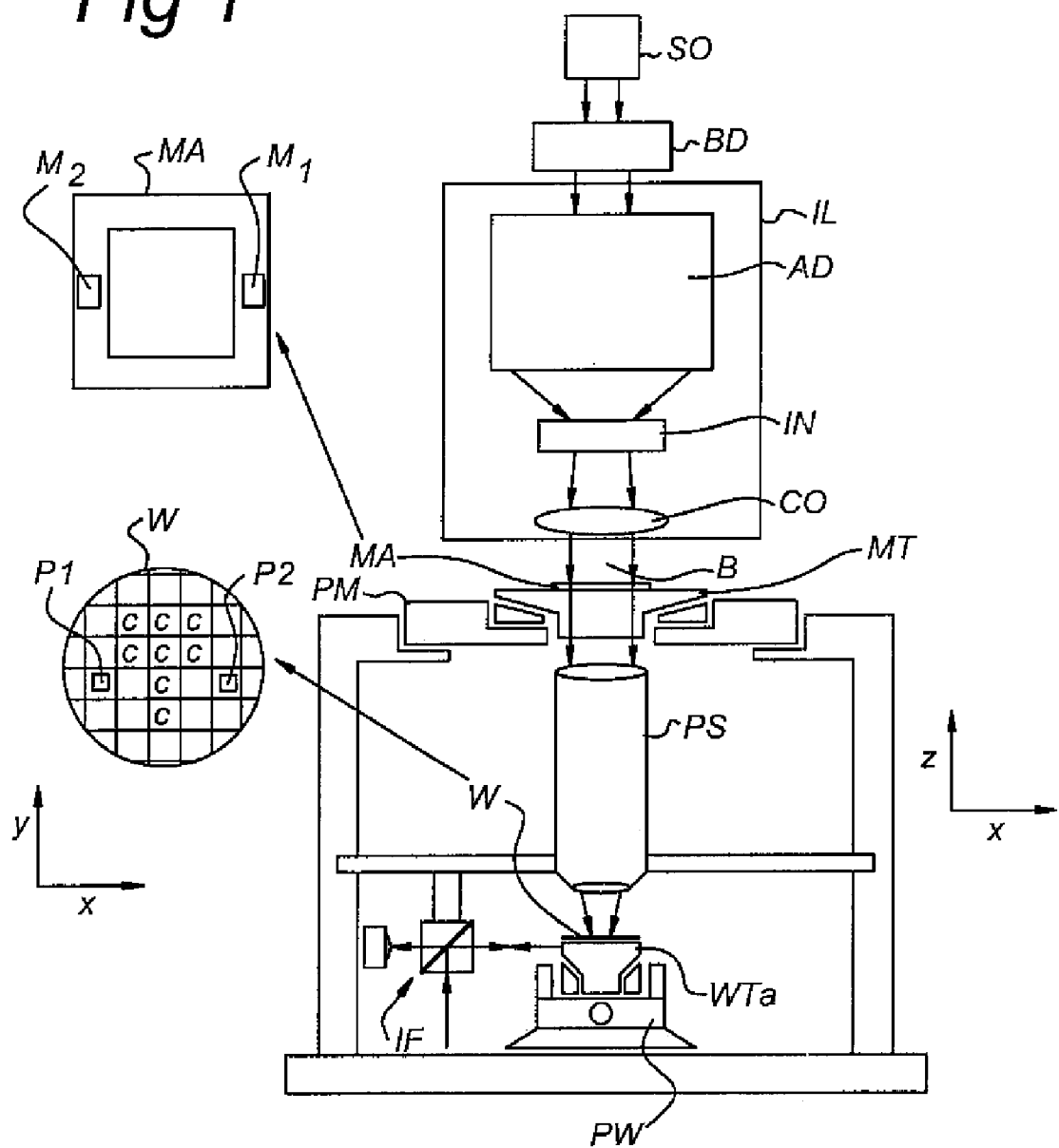
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a substrate table) WTa constructed to hold a substrate (e.g. a resist-coated substrate) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if used, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WTa are kept essentially stationary, while an entire pattern imparted to the radiation beam is projected onto a target portion C at one time (i.e. a single static exposure). The substrate table WTa is then shifted in the X and/or Y direction so that a different target portion C can be exposed. In step mode, the maximum size of the exposure field limits the size of the target portion C imaged in a single static exposure.

2. In scan mode, the mask table MT and the substrate table WTa are scanned synchronously while a pattern imparted to the radiation beam is projected onto a target portion C (i.e. a single dynamic exposure). The velocity and direction of the substrate table WTa relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WTa or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
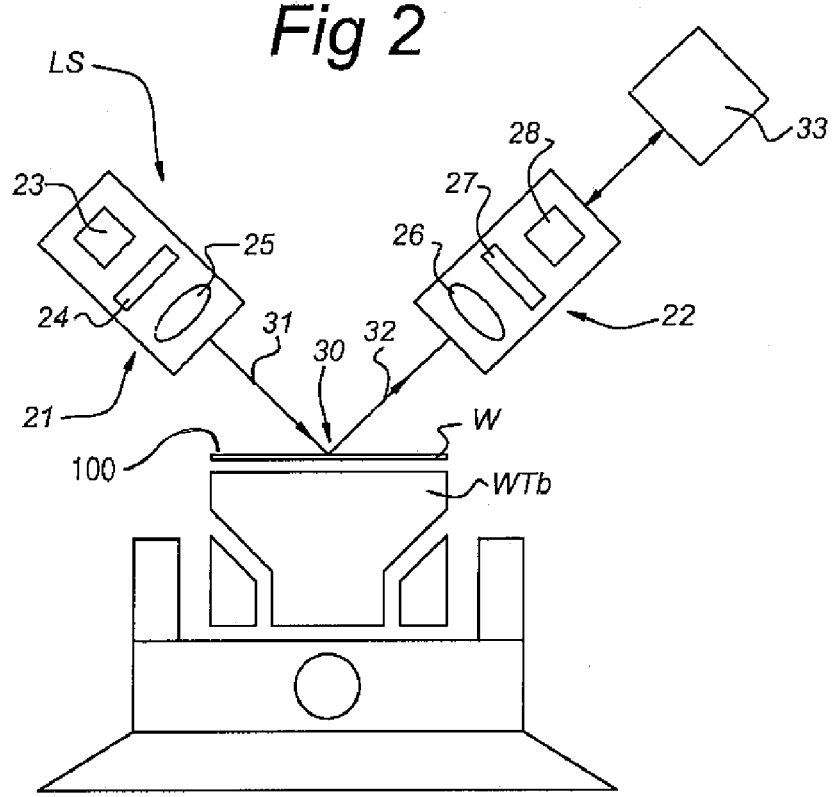
FIG. 2 shows a level sensor system according to an embodiment.

In an embodiment according to the invention a dual stage lithographic apparatus comprises a measurement station and an exposure station. The exposure station comprises a projection lens system PS. The measurement station comprises a substrate table WTb on which a substrate W is positioned. Above the substrate table WTb (FIG. 2), a level sensor LS system is arranged comprising a projection system 21 and a detection system 22. The projection system 21 comprises a radiation source 23, a projection grating 24 and an optical element 25. The detection system 22 comprises an optical element 26, a detection grating 27 and a detector 28. The projection system 21 is arranged to project a reference beam 31 and a measurement beam 31' (see FIG. 3) onto a predetermined plane. A reflecting surface 100 of the substrate W is positioned in the predetermined plane. The measurement beam renders spot 30 on the substrate W. This so-called LS spot 30 is reflected by a reflecting surface 100 resulting in a reflected measurement beam 32' which is detected by the detection system 22. The detection system 22 is arranged to send measurement signals to a processor 33.

In a height measurement based on the triangulation method, the transversal position of the reflected measurement beam 32' corresponds to the height of the reflecting surface 100. Here, the transversal position is meant to be a position in a plane through the measurement beam 31' and the reflected measurement beam 32' and in a direction perpendicular to the reflected measurement beam 32'. A change in the transversal position of the measurement beam 31', i.e. before it is reflected by the reflecting surface 100, will also be seen as a change in the transversal position of the reflected measurement beam 32'. The position of the reference beam is measured in the same way, i.e. the transversal position in determined. The detection system is arranged to send a measurement signal corresponding to the transversal position of the reflected measurement beam 32' and a reference signal corresponding to the transversal position of the reflected reference beam 32 to the processor 33.

Figure 3:
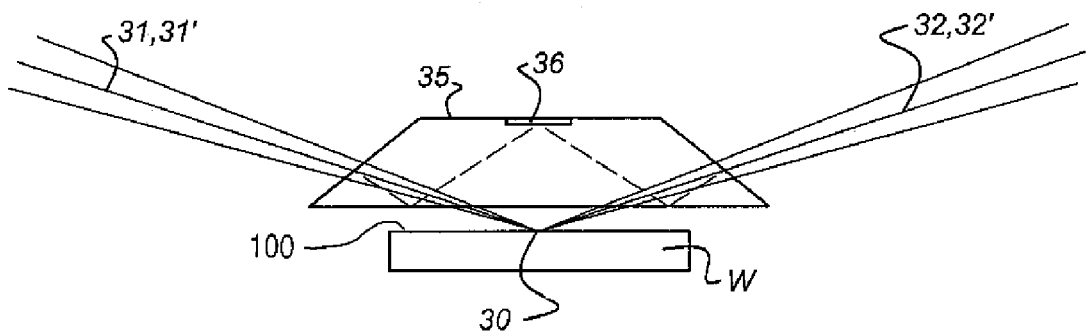
FIG. 3 shows an optical arrangement for deviating the measurement beam, according to an embodiment.

The reference beam 31 is deviated just upstream from the substrate W. Without the deviation, the reference beam 31 would render an associated measurement position on the substrate W. This deviation can be done with a prism or a set of mirrors which deviates part of the beams as produced by radiation source 23. Seen from the side (FIG. 3) a prism 35 is positioned just above one associated measurement position which lies next to the LS spot 30. Because of the configuration of the prism 35, the reference beam 31 is deviated and is not projected onto the substrate W. Instead it is projected onto the top surface of the prism 35 rendering a reference spot 36. The reference beam 31 is reflected three times internally within the prism 35, as shown, and produces a reflected reference beam 32 which comprises an image of spot 36. This image of the reference spot 36 is detected by a reference detector 28r (FIG. 4) in detection system 22, that produces a reference signal that is sent to processor 33 for further evaluation. In FIG. 3 the deviated optical beam inside the prism 35 is indicated by a dotted line.

With the optical reference path being the path followed by the reference beam between the projection system 21 and the detection system 22, the optical path is made insensitive to the position of the reflecting surface 100 of the substrate W because the reference beam never reaches the reflecting surface 100.

The prism 35 is fixedly attached to the projection system 21, to the detection system 22 or to both. Alternatively, the prism is attached to a metrology frame to which the projection system 21 and the detection system 22 are attached. The metrology frame is isolated from vibrations caused by moving the substrate table WTb. Only a select set of systems is attached to the metrology frame. Those systems may only cause vibrations in a certain frequency range in which frequency range the metrology frame cushions the vibrations, for instance by being heavy, being supported on air mounts that are designed and or adjusted for that certain frequency range, and by having no eigenvalues in that frequency domain. The position of the prism 35 is therefore insensitive to the position of the projection lens system PS, which is present at the exposure station whereas the prism 35 is present in the measurement station. Because the position of the prism is insensitive to the position of the projection lens system PS, the position of the reference beam 31, 32 is also insensitive to the position of the projection lens system PS.

It will be clear that by directing a measurement beam (31', 32') and a reference beam (31, 32) along parallel paths throughout the whole measurement branch (21) and the whole reference branch (22), and only deviating the reference beam (31, 32) from a path parallel to the measurement beam (31', 32'), transversal displacements throughout the whole measurement branch (21) and the whole reference branch (22) can be corrected for. The quality of the correction can be increased by having the measurement beam (31', 32') and the reference beam (31, 32) overlap, which will be explained later.

A measurement beam 31' is projected onto an LS spot 30 next to the reference spot 36 that is covered by the prism 35. The measurement beam 31' is depicted by a straight line in FIG. 3, being reflected by the substrate W. The measurement beam 31' is reflected by the reflecting surface 100 of substrate W to produce reflected measurement beam 32' comprising an image of spot 30. This image of spot 30 is detected by detector 28 that produces a measurement signal for processor 33.

Figure 4:
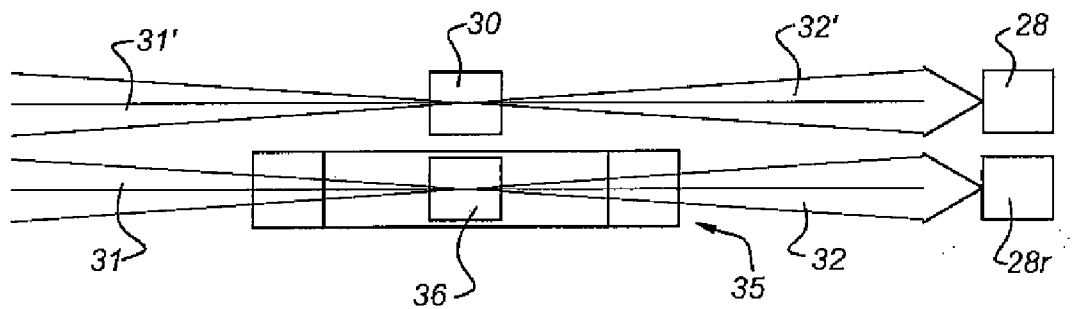
FIG. 4 shows a top view of FIG. 3.

To better explain this embodiment, a top view of the two LS spots is shown in FIG. 4. FIG. 4 shows the two beams 31, 31'. Reference beam 31 is directed through the prism 35 and finally detected by reference detector 28r. FIG. 4 shows clearly the proximity of the prism 35 and the LS spot 30. The measurement beam 31 is reflected by the substrate W and detected by the detector 28, referred to as measurement detector. It will be clear to the man skilled in the art, that more measurement beams may be projected by the projection system 21 and detected by the detection system 22. The measurement beams are preferably parallel to each other and render LS spots 30 parallel to one another in a direction perpendicular to FIG. 2. Likewise, more reference beams may be present projected by the projection system 21 and detected by the detection system 22. The reference beams are also preferably parallel to each other.

Figure 6:
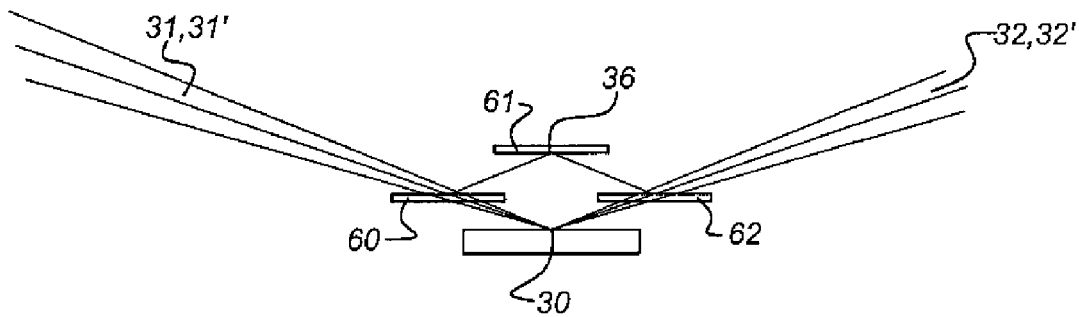
FIG. 6 shows an optical arrangement for deviating the measurement beam, according to another embodiment.
Figure 7:
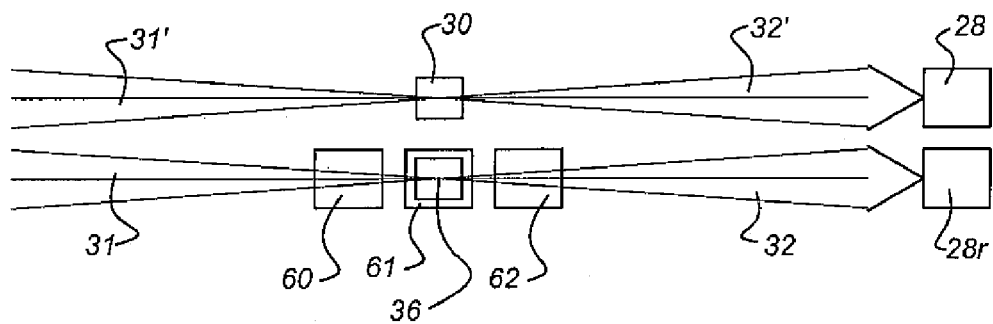
FIG. 7 shows a top view of FIG. 6.

Instead of using a prism, mirrors can be used as is shown in FIG. 6 showing a side view and FIG. 7 showing a top view of an alternative embodiment. In this embodiment, three mirrors 60, 61, 62 are positioned just above one LS spot 30, so as to deviate the reference beam 31 and project it to reference spot 36, i.e. on the mirror 61. Mirror 61 reflects reference beam 31 and directs it to mirror 62, which reflects it again to produce reflected reference beam 32. In the set-up of FIGS. 6 and 7, the measurement beam 31' is not deviated but only reflected by the reflecting surface 100 of substrate W, as in the set-up of FIGS. 3, 4.

Figure 5:
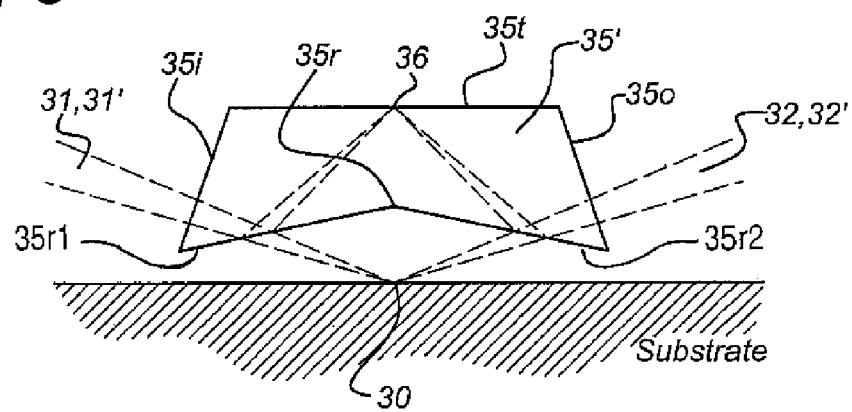
FIG. 5 shows a special embodiment of the arrangement of FIG. 3.

In the prism configuration of FIGS. 3, 4, the deviated optical path is very stable, noise-free and drift-free, because there will be no air-flow in the glass and the mechanical construction is very stable. An air-flow in a situation where the air is not homogenous may cause a change in the gradient of the index of refraction perpendicular to the deviated optical path. A change in the gradient will change position of the deviated optical path. The index of refraction of the material of the prism is very stable throughout the prism, so that the gradient of the index of refraction is set by the prism. The prism configuration can be modified to compensate the extra path length in the prism 35 and to reduce the dispersion effect caused by refraction, as depicted in FIG. 5. In the embodiment using mirrors 60, 61 and 62 the deviated optical path can be made very stable, noise-free and drift-free by applying an air shower (not shown) controlling the air along the deviated optical path. The air shower passes a constant, preferably laminar stream of air through the deviated optical path. By having a constant, laminar stream of air through the deviated optical path, the index of refraction is constant. Both the purity and the temperature of the supplied air can be controlled. This air is, for example, of purity class 1 and its temperature is, for example, stable within 0.1° C.

It will be appreciated by the man skilled in the art, that optical beams, such as the measurement beam 31', 32' and the reference beam 31, 32 by definition pass through a medium (for instance vacuum, air, a gaseous mixture or a liquid).

In the embodiment illustrated in FIG. 5, an alternative prism 35' is used having an input surface 35i, an output surface 35o, a top surface 35t and a reflective surface 35r. The input surface 35i is arranged substantially perpendicular to reference beam 31 whereas output surface 35o is arranged substantially perpendicular to reflected reference beam 32. The reflective surface 35r is not flat but has a first sub-surface 35r1 and a second sub-surface 35r2 connected to one another under a predetermined angle. The reflective surface receives reference beam 31 after transmission through input surface 35i, reflects reference beam 31 at the first sub-surface 35r1 to form reference spot 36 on the top surface 35t of the prism 35'. The top surface 35t reflects reference beam 31 towards the second sub-surface 35r2 which reflects the received beam to form reflected reference beam 32. The advantage of prism 35' in FIG. 5 compared to the prism 35 in FIG. 3 is that the prism 35' does not show dispersion because the glass-air interfaces at surfaces 35i and 35o are substantially perpendicular to the beams 31, 31', 32, 32'.

Figure 8:
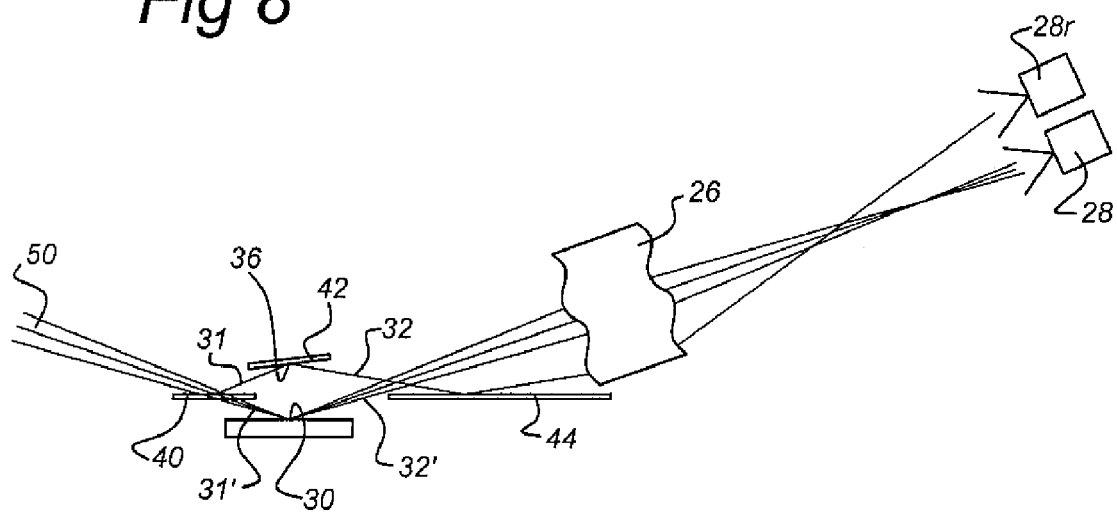
FIG. 8 shows an arrangement according to yet another embodiment.

In another embodiment, an original beam 50 is split into measurement beam 31' and reference beam 31 using, for example, a semi-transparent mirror, as shown in FIG. 8. A semi-transparent mirror 40 reflects a portion, e.g., 50%, of original beam 50 to form reference beam 31 and transmits the remaining portion of the original beam 50 to form measurement beam 31'. The reference beam 31 is imaged as reference spot 36 on a mirror 42 that may have a tilted orientation towards wafer W. The mirror 42 reflects the reference beam 31 to mirror 44 that produces reflected reference beam 32 that is directed via optical element 26 towards reference detector 28r. The measurement beam 31' is reflected by a reflecting surface 100 of the wafer W. Both the reflected reference beam 32 and the reflected measurement beam 32' are passing through this same optical element 26. The embodiment of FIG. 8 can be extended for a plurality of original beams, i.e., for an embodiment with a plurality of semi-transparent mirrors, a plurality of reference beams and associated measurement beams.

Figure 9:
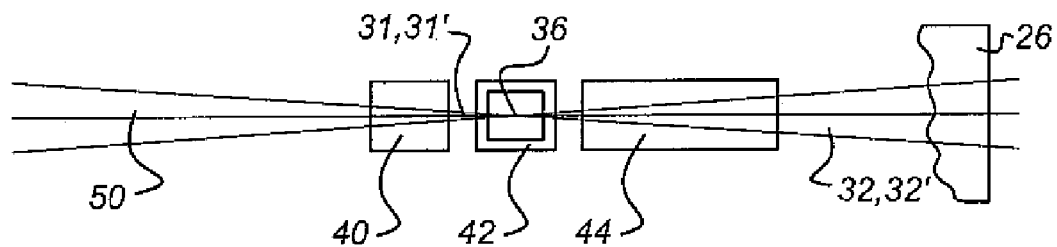
FIG. 9 shows a top view of FIG. 8.

FIG. 9 shows a top view of the embodiment of FIG. 8. Note that measurement spot 30 is covered by mirror 42 in this view. The design in FIGS. 8, 9 can be made for several spots, where every measurement spot 30 is associated with its own reference spot 36.

In an aspect of the invention, a dual stage lithographic apparatus is provided comprising a level sensor LS as described above. After measuring the height on all measurement positions on the substrate W at the measurement stage, a 'wafer map' is determined. Next, the shape of the disturbance measured with the reference beam(s) 31 (i.e. length, amplitude, frequency, correlation, difference) can be used to produce a corrected wafer map using one or more of the correction methods described below.

The principle of the correction methods is based on the following. It is assumed that the total noise and drift measured by the reference beam(s) 31 is identical to the noise and drift of the measurement beam(s) 31', but the reference beam 31 does not contain height information about the measured position. The signal of the reference beam(s) 31 can then be used by processor 33 for correcting measurement results of one or more of the measurement beams.

The reproducibility and accuracy of the position measurement is increased by reducing noise and drift caused by movement of mechanical and optical parts of the system, drift and noise of electrical parts of the system and changes in the (optical) refractive-index of the media (e.g. air, glass) through which beams 31, 31' pass. Furthermore, synchronous detection increases the correlation between noise and drift in the reference beam 31 with the noise and drift in the measurement beam 31', which contains the position information. Therefore the noise in the measurement signal may be removed by processor 33 after correction with the reference signal. Because the optical path of the reference beam 31 and the measurement beam 31' are essentially the same (preferable but not required), the noise and drift in the reference signal have a high correlation with respect to the noise and drift in the measurement signal which contains the position (i.e. height) information. Therefore, the noise in the position measurement signal(s) may be removed by processor 33 by correction with the reference signal from the reference beam(s). When the reference detector 28r for detecting the reference beam(s) and measurement detector 28 for detecting the measurement beam 31' is the same, the noise and drift introduced during detection of the reference signal and the measurement signal are the same. Therefore the noise in the measurement signal may be removed by processor 33 by correction with the reference signal.

Due to the fact that the additional optical arrangement, e.g. the prism 35, 35' and mirrors 60, 61, 62, 40, 42, 44 is positioned just before the measurement spot, the only place where the reference beam 31 propagates along a different path than the actual measurement beam 31' is near the spot 30 on the measurement sample (e.g. substrate W). However, this part of the optical system is less sensitive for air flows or temperature gradients than the rest of the system. The most sensitive part for changes in the (optical) refractive-index of the optical system is far from the focal point where the image is formed on the substrate W. At this position the reference beam 31 and the measurement beam 31' overlap and the disturbances caused in both beams at this position are exactly the same (high correlation). Therefore, the noise and drift caused in this part can be compensated for totally using the level LS sensor according to the invention.

Figure 10:
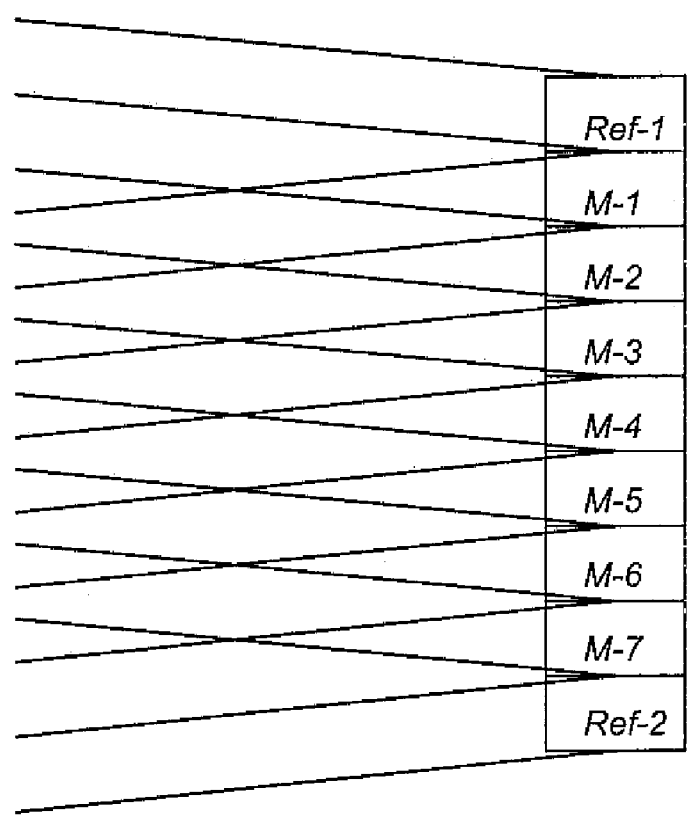
FIG. 10 shows an embodiment of the positioning of measurement spots with respect to reference spots.

FIG. 10 shows several measurement spots M-1 to M-7 and reference spots Ref-1 and Ref-2 in an embodiment of the invention. All of these spots M-1, M-7, Ref-1, Ref-2 may each be imaged on one detector or a plurality of detectors. FIG. 10 is a top view and it should be noted that the measurement spots M-1, M-7 are focussed on the substrate W but the reference spots Ref-1, Ref-2 are actually focussed onto, e.g., the top side of prism 35 or mirror 61, 42. The location of the measurement spots M-1, M-7 on the substrate W (in focus) in this embodiment is determined by the projection grating 24 and the detection grating 27. The apertures of both gratings 24, 27 and the layout of the mirrors 60, 61, 62, 42, 44 and prism 35 determine the positions of the reference spots Ref-1, Ref-2.

It should be noted that instead of using gratings, the invention also works with a configuration in which the measurement spots are produced using multiple radiation sources such as for example, laser sources, each source producing one measurement beam.

When the reflecting surface 100 (not shown) of the substrate W (not shown) is out of focus with respect to the projection system 21, the measurement spots M-1 and M-2 will overlap, because of the divergence (Numerical Aperture>0) of the beams. The same is valid for the other neighbouring measurement spots. Overlapping measurement spots will have the same disturbance and the detected signal will have high correlation. Detection signals of spots close to each other will have the highest correlation. The correlating part of detection signals of two spots which are not next to each other (e.g. Ref-1 and Ref-2, see FIG. 10), is the same in all intermediate spots (M-1-M-7) located between these two spots.

Described in another way, the beams overlap outside an image plane of the projection branch. At the image plane, the intermediate spots are sharply imaged and do not overlap. Even the reference beams overlap as far as they are not deviated from their paths to associated spots on the reflecting surface 100. The larger the part where a reference beam and a measurement beam overlap and are parallel, the higher the correlation between transversal displacements in the reference beam and the measurement beam.

There may be several noise contributions/disturbances:

Optical disturbance via contamination, temperature, refractive index changes in the optical path of the level sensor beams, LS signal noise from substrate height, measurement, Electronic noise from level sensor LS, Drift (electrical or mechanical) due to temperature changes, Mechanical resonance/vibrations of LS components.

According to embodiments of the invention, the processor 33 may use different correction methods to filter out disturbances in the measurement beams. For example, the disturbance of measurement beams can be determined by using interpolation of reference signals associated with the reference beams at different locations around or between these measurement beams.

If processor 33 measures a high correlation between time traces of different reference signals, a high correlation between the disturbance of the reference beam(s) and the measurement beam(s) may be expected. A correlation coefficient relating to this correlation can be used by processor 33 as a weighting factor for how much correction should be used.

If processor 33 measures only a high correlation for a part of the frequency spectrum or even a certain frequency peak (e.g. resonance of the system) between the measurement signals and the reference signal(s), a correction for only this part of the spectrum may be made by processor 33.

If processor 33 measures a delay between time traces of different reference signals, then there will also be a delay between the disturbance of the reference beam(s) and the different measurement beams. In this case, a delay correction method may be used by processor 33.

If processor 33 measures only a phase shift (delay) for a part of the frequency spectrum or even a certain frequency peak (e.g. resonance of the system) between the measurement signals and the reference signal(s), a correction for only this part of the spectrum can be used by processor 33.

In an embodiment, per stroke, per die or per measurement point, any correction method can be switched on/off, based on the reference signals.

These correction methods may be used in an off-line measurement situation like in a dual-stage apparatus, because the shape of the measurement signal(s) and the reference signal(s) (i.e., their behavior as function of time) has to be known, as well as a possible correction before the correction can be applied during exposure. Such a correction may take the form of a corrected wafer map. Then, the substrate W may be exposed based on the corrected wafer map.

In an embodiment, two or more reference beams 31 at different locations around or between the measurement spots 30 are used, e.g. 2 reference beams 31 on left- and right-side of the measurement spots 30.

It is also possible to determine a relation between disturbances in the reference beams 31 and disturbances in the measurement beams 31' in advance, resulting in calibration data. The signal of the measurement beam(s) 31' may be processed by processor 33 using the reference signal(s) and these calibration data.

In an embodiment, disturbances in the measurement spots M-1-M-7 are determined using information from the reference spots Ref-1, Ref-2 and an interpolation algorithm. Now, an example of a simple practical implementation of such an interpolation is given, in which ZM-x(t) is a measurement signal produced by a measurement detector detecting measurement spot M-x, and wherein ZRef-y(t) is a reference signal produced by a reference detector detecting reference spot Ref-y.

$ZM\text{-}1(t):=ZM\text{-}1(t)-0.875*Zref\text{-}1(t)-0.125*Zref\text{-}2(t)$ $ZM\text{-}2(t):=ZM\text{-}2(t)-0.750*Zref\text{-}1(t)-0.250*Zref\text{-}2(t)$ $ZM\text{-}3(t):=ZM\text{-}3(t)-0.625*Zref\text{-}1(t)-0.375*Zref\text{-}2(t)$ $ZM\text{-}4(t):=ZM\text{-}4(t)-0.500*Zref\text{-}1(t)-0.500*Zref\text{-}2(t)$ $ZM\text{-}5(t):=ZM\text{-}5(t)-0.375*Zref\text{-}1(t)-0.625*Zref\text{-}2(t)$ $ZM\text{-}6(t):=ZM\text{-}6(t)-0.250*Zref\text{-}1(t)-0.750*Zref\text{-}2(t)$ $ZM\text{-}7(t):=ZM\text{-}7(t)-0.125*Zref\text{-}1(t)-0.875*Zref\text{-}2(t)$ In an embodiment, a correlation algorithm is used by processor 33. Processor 33 calculates correlation coefficients between data sets. The dataset is a time sequence of height measurements associated with measurement spots 30. The calculated correlation coefficients between measurement signals tell something about the kind of noise influencing the level sensor LS. E.g., purely correlated noise causes a standard deviation in a measured height and may cause tilt when the noise for different spots has a phase difference (delay). On the other hand, purely uncorrelated noise causes a standard deviation in measured tilt. Combinations of correlated and un-correlated noise cause deviation in both measured height and measured tilt. In practice, noise of level sensor LS turns out to be highly correlated (correlation coefficient about 0.9), which implies that a small increase of uncorrelated (e.g. C&T=contamination and temperature control) noise causes a relatively large increase of tilt noise. Most useful about a correlation analysis is the change of it with a change in the system.

Correlation coefficients may also be calculated by processor 33 as a function of shift in time of the measurement signals and reference signals with respect to each other. This gives information about spatially moving effects on noise of the level sensor LS (air flows for instance).

Processor 33 may produce Fourier signals in the frequency domain of received measurement and reference signals. Then, processor 33 can perform a Fourier analysis. In a Fourier analysis of measurement signals, the processor may use amplitude information and phase information. The phase information gives similar information as described above for shifted correlation. The following insight may be used. A correlation coefficient corrcoef (P1, P2) between two signals P1, P2 is defined as:

$corrcoef(P1,P2)=cov(P1,P2)/sqrt(cov(P1,P1)\times cov(P2,P2))$ where cov(P1, P2) is a covariance defined by:

$cov(P1,P2)=E((P1-avP1)\times(P2-avP2))$ where E( . . . ) is an expectation value and av . . . an average value.

Applying these equations on Fourier transformed time signals turns out to be simple. The time averaged value av . . . is zero. P1 and P2 are single sines with an amplitude and a phase.

$cov(P1,P2)=E(A1\times\sin(\omega t+phi1),A2\times\sin(\omega t+phi2))$ $=\tfrac{1}{2}\times A1\times A2\times E(\cos(phi1-phi2)-\cos(2\omega t+phi1+phi2))$ $=\tfrac{1}{2}\times A1\times A2\times \cos(dphi)$ where:
A1, A2=amplitudes of P1, P2
phi1, phi2=phases of P1, P2
dphi=phi1−phi2
Since cov(Pi, Pi)=½×Ai2, these equations yield:

$corrcoef(f)=\cos(dphi(f))$

Processor 33 may use a so-called "cohere" function. The "cohere" function from MatLab, (see, e.g., MATLAB: Copyright 1984-2001 The MathWorks, Inc., Version 6.3) estimates a magnitude squared coherence function using Welch's averaged periodogram method, see Rabiner, L. R., Gold, B., *Theory and Application of Digital Signal Processing*. Englewood Cliffs, N.J.: Prentice-Hall, 1975, and Welch, P. D. "*The Use of Fast Fourier Transform for the Estimation of Power Spectra: Method Based on Time Averaging Over Short, Modified Periodograms.*" IEEE Trans. Audio Electroacoust. Vol. AU-15 (June 1967). Pgs. 70-73.

For example, Cxy=cohere(x,y) finds a magnitude squared coherence estimate Cxy of two input signals x and y using Welch's averaged, modified periodogram method. The magnitude squared coherence estimate Cxy is a function of frequency with values between 0 and 1 that indicates how well x corresponds to y at each frequency. The coherence is a function of the power spectral densities (Pxx and Pyy) of x and y and the cross power spectral density (Pxy) of x and y.

$$C_{xy}(f) = \frac{|P_{xy}(f)|^2}{P_{xx}(f)P_{yy}(f)}.$$

Signals x and y must have the same length in the frequency domain. For real x and y, coherence returns a one-sided coherence estimate and for complex x or y, it returns a two-sided estimate.

EXAMPLE 1

Now an example of application of these equations to a reference signal Zref(t) and measurement signal ZM(t) is given. These Zref(t) and ZM(t) are Fourier transformed by processor 33 rendering Z-ref($\omega$) and Z-M($\omega$), respectively. A correlation/coherence CM-ref($\omega$) between the reference signal Z-ref($\omega$) and the measurement signal Z-M($\omega$) per frequency is calculated by processor 33. Then, processor corrects the measurement signal Z-M($\omega$) rendering a corrected measurement signal ZcorrM($\omega$) while using the correlation CM-ref($\omega$) according to:

$$ZcorrM(\omega):=Z-M(\omega)-\{CM-ref(\omega)*Z-ref(\omega)\} \quad (1)$$

After this, the corrected measurement signal ZcorrM($\omega$) is inverse Fourier transformed, into a corrected measurement signal ZcorrM(t).

In this example, the assumption is made that the measurement signal from substrate W (which is only in the measurement signal) does not correlate with the reference signal from the reference beam 31. This is true in general, but when the height of substrate W is exactly the same as the disturbance, it will be masked by the correction.

EXAMPLE 2

In another example, processor 33 Fourier transforms two reference signals Zref-1(t), Zref-2(t) of reference spots into Z-ref-1($\omega$), Z-ref-2($\omega$), and Fourier transforms several measurement signals ZM-x(t) of measurement spots into Z-M-x($\omega$). The processor 33 calculates correlation/coherence Cr1-r2($\omega$) between these Fourier transformed reference signals Z-ref-1($\omega$), Z-ref-2($\omega$) per frequency. What correlates between these two Fourier transformed reference signals, will also correlate between measurement signals so it can be used by processor 33 for correction. Then, the processor 33 corrects Fourier transformed measurement signal Z-M-x($\omega$) to render corrected Fourier transformed measurement signals ZcorrM-x($\omega$), while using correlation Cr1-r2($\omega$ according to:

$$ZcorrM\text{-}1(\omega):=Z\text{-}M\text{-}1(\omega)-Cr1\text{-}r2(\omega)*\{0.875*Z\text{-}ref\text{-}1(\omega)+0.125*Z\text{-}ref\text{-}2(\omega)\}$$

$$ZcorrM\text{-}2(\omega):=Z\text{-}M\text{-}2(\omega)-Cr1\text{-}r2(\omega)*\{0.75*Z\text{-}ref\text{-}1(\omega)+0.25*Z\text{-}ref\text{-}2(\omega)\}$$

$$ZcorrM\text{-}3(\omega):=Z\text{-}M\text{-}3(\omega)-Cr1\text{-}r2(\omega)*\{0.625*Z\text{-}ref\text{-}1(\omega)+0.375*Z\text{-}ref\text{-}2(\omega)\}$$

$$ZcorrM\text{-}4(\omega):=Z\text{-}M\text{-}4(\omega)-Cr1\text{-}r2(\omega)*\{0.5*Z\text{-}ref\text{-}1(\omega)+0.5*Z\text{-}ref\text{-}2(\omega)\}$$

$$ZcorrM\text{-}5(\omega):=Z\text{-}M\text{-}5(\omega)-Cr1\text{-}r2(\omega)*\{0.375*Z\text{-}ref\text{-}1(\omega)+0.625*Z\text{-}ref\text{-}2(\omega)\}$$

$$ZcorrM\text{-}6(\omega):=Z\text{-}M\text{-}6(\omega)-Cr1\text{-}r2(\omega)*\{0.25*Z\text{-}ref\text{-}1(\omega)+0.75*Z\text{-}ref\text{-}2(\omega)\}$$

$$ZcorrM\text{-}7(\omega):=Z\text{-}M\text{-}7(\omega)-Cr1\text{-}r2(\omega)*\{0.125*Z\text{-}ref\text{-}1(\omega)+0.875*Z\text{-}ref\text{-}2(\omega)\} \quad (2)$$

In these equations, it is assumed that 7 measurement beams are used. After this, each corrected Fourier transformed measurement signal ZcorrM-x($\omega$) is inverse Fourier transformed, into a corrected measurement signal ZcorrM-x(t).

In example 2 the assumption is made that the correlation of the disturbance between both reference beams is smaller than or equal to the disturbance in the measurement spots. This is verified experimentally and by model analysis, but when the correlation of the disturbance between both reference beams is smaller than the disturbance in the measurement spots, not all disturbances are corrected in the measurement spot. (If correlation would be higher than disturbance in measurement spot, this would give overcorrection of disturbance).

The advantage of the embodiments which incorporate the dual stage apparatus in which a wafer map is measured off-line at a separate measurement stage, is that the correction at a certain time (t), is based on data before and after that time t, i.e., at times t−$\delta$ . . . t+$\delta$. All height measurements can be used, because they can be measured in advance. In a single stage apparatus only data which is already measured (t−$\delta$ . . . t) can be used by a processor in a correction operation. This reduces accuracy, because the number of data points is reduced and prediction from data in the past only is less accurate.

By using the method as explained above, reproducibility and accuracy of height measurements by a level sensor LS may be increased, by reducing noise and drift. The sensitivity of the level sensor LS for movements of mechanical and optical parts of the system, drift and noise of electrical parts of the system and changes in the (optical) refractive-index of the media (e.g. air, glass) is reduced significantly.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

We claim:

1. A lithographic apparatus comprising:
   a projection lens system;
   a projection branch arranged to direct a measurement beam towards a measurement position in a predetermined plane and to direct a reference beam towards a reference position;
   a detection branch being arranged to measure displacement of the measurement beam and the reference beam;
   a substrate stage for supporting an object having a first reflecting surface in the predetermined plane;
   an optical reference element arranged to direct the reference beam towards the detection branch via an optical reference path arranged to be insensitive to the position of the projection lens system and the first reflecting surface; and
   at least one of the projection branch and the reference branch arranged to direct the measurement beam and the reference beam along optical paths that are at least partially substantially equal in at least one of the projection branch and the reference branch, the optical reference element being arranged between the projection branch and the predetermined plane.

2. The lithographic apparatus according to claim 1, wherein at least one of the projection branch and the detection branch is arranged to direct the measurement beam and the reference beam along optical paths that are at least partially substantially parallel.

3. The lithographic apparatus according to claim 1, wherein at least one of the projection branch and the detection branch are arranged to direct the measurement beam and the reference beam along optical paths that at least partially overlap.

4. The lithographic apparatus according to claim 1, the lithographic apparatus having an optical measurement path in a measurement plane, the optical measurement path being a path from the measurement branch to the detection branch along which the measurement beam progresses, and further comprising a controller arranged to set a gradient along the measurement plane in the index of refraction of at least a part of at least one of the optical measurement path and the optical reference path to a predetermined, value.

5. The lithographic apparatus according to claim 1, wherein the optical reference element comprises a prism having an input surface arranged to receive the reference beam from the projection branch, a second reflective surface arranged to internally reflect the reference beam from the input surface, and an output surface arranged for outputting said reflected beam.

6. The lithographic apparatus according to claim 5, wherein the measurement beam and the reference beam are parallel in both the project ion branch and the reference branch;
   the measurement position and the reference position is in focus of the projection branch and the reference branch; and
   a third reflecting surface is arranged to reflect the reference beam at the reference position to a second position on the second reflecting surface after being reflected by the second reflecting surface in a first position.

7. The lithographic apparatus according to claim 6, wherein the first position is on a first sub-surface of the second reflecting surface, and wherein the second position is on a second sub-surface of the second reflecting surface, and wherein the first sub-surface and the second sub-surface are arranged at an angle.

8. The lithographic apparatus according to claim 5, wherein at least one of the input surface and the output surface is perpendicular to the optical path of the reference beam.

9. The lithographic apparatus according to claim 1, wherein the projection branch, the detection branch and the optical reference element is arranged to accommodate one or more additional measurement beams.

10. The lithographic apparatus according to claim 1, wherein
    the projection branch is arranged to direct one or more additional optical reference beams towards one or more additional reference positions;
    the detection branch is arranged to measure transversal displacement of the one or more additional reference positions;
    the optical reference element is arranged to direct the one or more additional reference beams via one or more additional optical reference paths that are insensitive to the position of the projection lens system and the first reflecting surface towards the detection branch; and
    the measurement beam, the reference beam and the additional reference beams are at least partially substantially equal in at least one of the projection branch and the reference branch.

11. The lithographic apparatus of claim 1, wherein the displacement of the measurement beam and the reference beam is a transversal displacement.

12. The lithographic apparatus of claim 1, the projection branch, detection branch and optical reference element comprise a level sensor.

13. The, lithographic apparatus of claim 1, wherein the at least partially substantially optical paths are at least partially substantially parallel.

14. The lithographic apparatus of claim 1, wherein the at least partially substantially optical paths at least partially overlap.

15. The lithographic apparatus of claim 1, wherein the at least partially substantially optical paths pass through a same medium.

16. The lithographic apparatus of claim 1, wherein the at least partially substantially optical paths have substantially equal path lengths along at least a portion of their respective optical paths.

* * * * *